United States Patent [19]
Yu

[11] Patent Number: 6,055,143
[45] Date of Patent: *Apr. 25, 2000

[54] ELECTROSTATIC DISCHARGE PROTECTION CIRCUIT TRIGGERED BY EPROM

[75] Inventor: Ta-Lee Yu, Hsinchu Hsien, Taiwan

[73] Assignee: Winbond Electronics Corporation, Taiwan

[ * ] Notice: This patent is subject to a terminal disclaimer.

[21] Appl. No.: 09/073,146

[22] Filed: May 5, 1998

[30] Foreign Application Priority Data

Jan. 9, 1998 [TW] Taiwan .................................. 87100244

[51] Int. Cl.⁷ ....................................................... H02H 9/00
[52] U.S. Cl. ............................................................... 361/56
[58] Field of Search ............................. 361/56, 111, 119, 361/91.9, 91.5; 257/355

[56] References Cited

U.S. PATENT DOCUMENTS

| | | | |
|---|---|---|---|
| 5,452,171 | 9/1995 | Metz et al. ................................. | 361/56 |
| 5,465,189 | 11/1995 | Polgreen et al. .......................... | 361/58 |
| 5,528,188 | 6/1996 | Au et al. .................................. | 327/310 |
| 5,671,111 | 9/1997 | Chen ........................................ | 361/56 |
| 5,869,873 | 2/1999 | Yu ........................................... | 257/362 |
| 5,909,347 | 6/1999 | Yu ............................................ | 361/56 |

*Primary Examiner*—Ronald W. Leja
*Attorney, Agent, or Firm*—Fish & Richardson P.C.

[57] ABSTRACT

An electrostatic discharge protection circuit protects an internal circuit that is coupled to a pad from electrostatic discharge damage. The electrostatic discharge protection circuit comprises at least one silicon-controlled rectifier and an erasable programmable read only memory. The silicon-controlled rectifier is configured with an anode and a cathode connected to the pad and a grounding node, respectively. The erasable programmable read only memory is configured with a drain connected to the pad, a source connected to the grounding node, and a control gate connected to the grounding node. Accordingly, the erasable programmable read only memory enters breakdown to be programmed and triggers the silicon-controlled rectifier to conduct a current when electrostatic discharge stress occurs at the pad.

13 Claims, 5 Drawing Sheets

ELECTROSTATIC DISCHARGE PROTECTION CIRCUIT TRIGGERED BY EPROM

BACKGROUND OF THE INVENTION

1. Field of the Invention

The present invention generally relates to semiconductor integrated circuit technology. In particular, the present invention relates to an electrostatic discharge protection circuit which is triggered to conduct a discharge current so as to bypass electrostatic discharge stress occurring to an integrated circuit pad by means of an erasable programmable read only memory at a low trigger voltage.

2. Description of the Prior Art

Electrostatic discharge, ESD hereinafter, is a common phenomenon that occurs during the handling of semiconductor integrated circuit, IC hereinafter, devices. Electrostatic charges may accumulate and cause potentially destructive effects on an IC device. ESD stressing typically can occur during a testing phase of IC fabrication, during installation of the IC onto a circuit board, as well as during use of equipment into which the IC has been installed. Damage to a single IC due to poor ESD protection in an electronic device can partially or sometimes completely hamper its operation.

There are several ESD stress models based on the reproduction of typical discharge pulses to which the IC may be exposed during manufacturing or handling. Three standards models, known as the Human Body Model (HBM), Machine Model (MM), and Charged Device Model (CDM) have been proposed. The human-body model is set forth in U.S. Military Standard MIL-STD-883, Method 3015.6. The military standard models the electrostatic stress produced on an IC device when a human carrying electrostatic charges touches the lead pins of the IC device. The machine model is set forth in Industry Standard EIAJ-IC-121, which describes the electrostatic stress produced on an IC device when a machine carrying electric charges contacts the lead pins of the IC device. The charged device model describes the ESD current generated when an IC already carrying electric charges is grounded while being handled.

However, with the trend toward submicron scale IC fabrication in view, CMOS IC have become more vulnerable to ESD damage due to advanced processes, such as use of a lightly-doped drain ("LDD") structure and clad silicide diffusions. Therefore, lateral silicon-controlled rectifiers (LSCRs) have been utilized as main components of ESD protection circuits for facilitating ESD,protection. As an example, R. N. Rountree et al., "A PROCESS-TOLERANT INPUT PROTECTION CIRCUIT FOR ADVANCED CMOS PROCESSES," has been proposed in *EOS/ESD Symp. Proc.*, EOS-10, pp. 201–205, 1988.

Referring to FIG. 1, a conventional lateral silicon-controlled rectifier, hereinafter LSCR, is schematically illustrated in a top view. The conventional lateral silicon-controlled rectifier is fabricated in a P-type semiconductor substrate 10 having an N-well 11 formed therein. A P-type doped region 12 and an N-type doped region 13 are formed within the N-well 11 while another N-type doped region 14 and P-type doped region 15 are formed in the P-type semiconductor substrate 10. The P-type doped region 12 is electrically connected with the N-type doped region 13 to be an anode 16 of the LSCR while the N-type doped region 14 and P-type doped region 15 are tied together to be a cathode 17 thereof. A cross-sectional view taken along a line II—II of FIG. 1 is illustrated in FIG. 2.

As shown in FIG. 2, the P-type doped region 12, N-well 11, and P-type semiconductor substrate 10 serve as the emitter, base, and collector, respectively, of a PNP bipolar junction transistor. In addition, the N-well region 11, the P-type semiconductor substrate 10, and the N-type doped region 14 serve as the collector, base, and emitter, respectively, of a NPN bipolar junction transistor.

However, there is one inherent constraining design factor for the LSCR's used in ESD protection circuits for sub-micron semiconductor devices. The required voltage for triggering conventional LSCR's heavily relies upon the junction breakdown between the P-type semiconductor substrate 10 and the N-well 11, being therefore in the range of about 30~50 V. Nevertheless, the typical thickness of gate oxide layers in CMOS fabrication processes employing a resolution of 0.6–0.8 microns is about 150–200 angstroms. Taking a dielectric breakdown strength of 10 MV/cm for typical SiOX material into consideration, the gate oxide layers in these sub-micron CMOS devices would have been destroyed by a voltage of about 15~20 V. Even worse, as to 0.5 μm feature size CMOS technology with a gate oxide thickness of 105 angstroms, measurable Flower-Nordheim tunneling through the gate oxide starts at around 7 V and oxide breakdown occurs at about 14.5 V. Therefore, the conventional LSCR's have no effect on ESD protection for sub-micron CMOS IC devices.

Therefore, there is a need to provide an electrostatic discharge protection circuit that is triggered at a voltage lower than the breakdown voltage of gate oxide layers, especially suitable for sub-micron CMOS fabrication, by means of an erasable programmable read only memory to confirm ESD protection efficacy.

SUMMARY OF THE INVENTION

Therefore, an object of the present invention is to provide an electrostatic discharge protection circuit, which can be positioned at input pads or output pads, to be triggered at a low voltage so as to protect an internal circuit from ESD damage.

Another object of the present invention is to provide an electrostatic discharge protection circuit, which can record any ESD event occurring during phases of testing, installation, use, etc.

A further object of the present invention is to provide an electrostatic discharge protection circuit having an erasable programmable read only memory, whose control gate is free of floating.

The present invention achieves the above-indicated objects by providing an electrostatic discharge protection circuit for protecting an internal circuit that is coupled to a pad. The electrostatic discharge protection circuit comprises at least one silicon-controlled rectifier and an erasable programmable read only memory. The silicon controlled rectifier is configured with an anode and a cathode connected to the pad and a circuit node, respectively. The erasable programmable read only memory is configured with a drain connected to the pad, a source connected to the circuit node, and a control gate connected to the circuit node. Accordingly, the erasable programmable read only memory enters breakdown to be programmed and triggers the silicon-controlled rectifier to conduct a current when electrostatic discharge stress occurs at the pad.

Accordingly, when ESD stress occurs to the pad, the EPROM enters breakdown and triggers the SCR to operate in the snapback region for bypassing the ESD stress, thereby protecting the internal circuit from ESD damage. By this way, the electrostatic discharge protection circuit according to the present invention can be triggered at the low voltage at which the EPROM enters breakdown. Moreover, the electrostatic discharge protection circuit according to the present invention can record any ESD event occurring during phases of testing, installation, usage, etc.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

According to the present invention, an electrostatic discharge protection circuit is triggered to conduct a discharge current and thus bypass electrostatic discharge stress occurring to an integrated circuit pad by means of an erasable programmable read only memory at a low trigger voltage.

Figure 1:
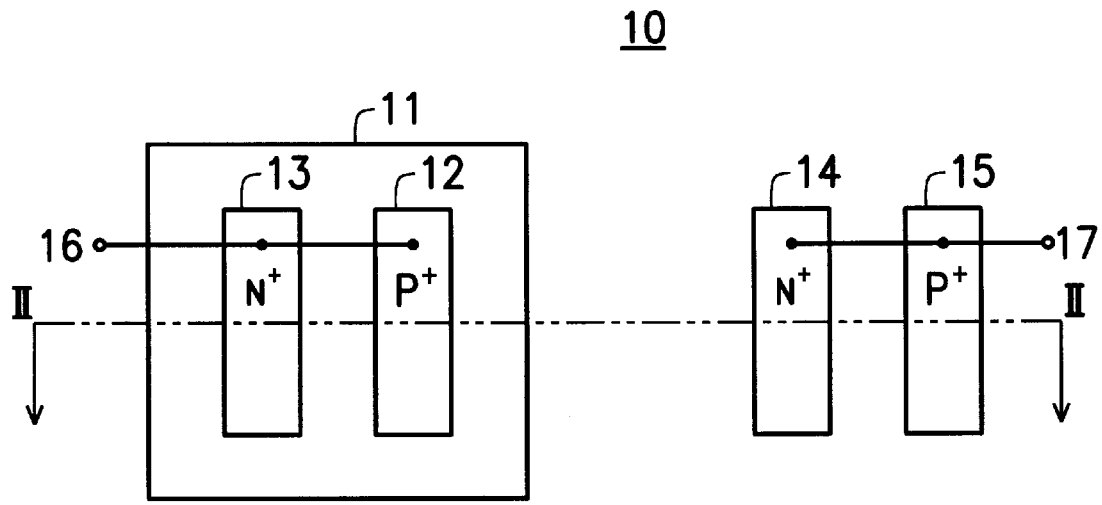
FIG. 1 schematically illustrates a conventional lateral silicon-controlled rectifier in a top view.
Figure 2:
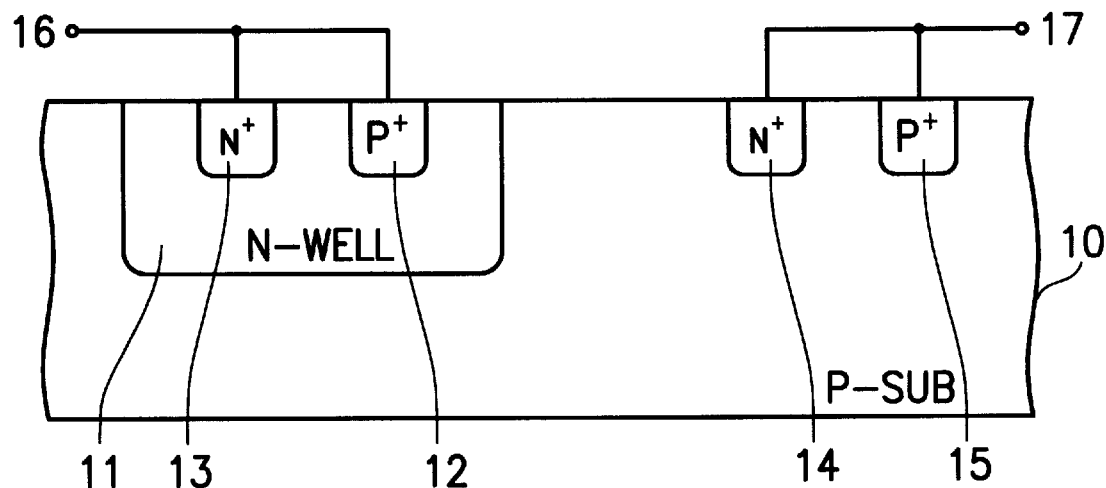
FIG. 2 schematically illustrates a cross-sectional view, taken along a line II—II, of FIG. 1.
Figure 3:
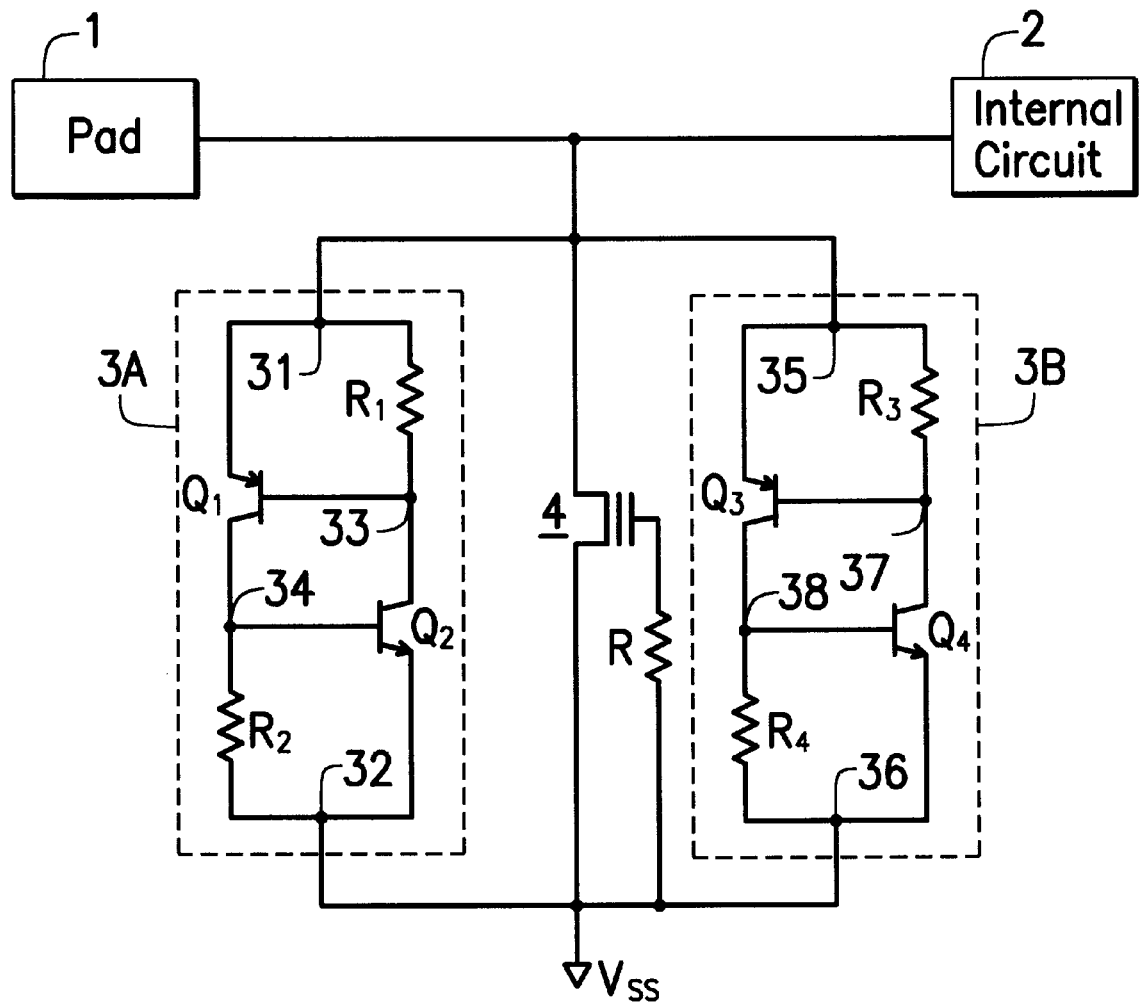
FIG. 3 schematically illustrates a circuit diagram of one preferred embodiment in accordance with the present invention.

Referring to FIG. 3, a circuit diagram of one preferred embodiment in accordance with the present invention is schematically illustrated. The ESD protection circuit according to the present invention is arranged at an integrated circuit pad 1, comprising at least one silicon-controlled rectifier, hereinafter SCR, and an erasable programmable read only memory 4, hereinafter EPROM. The pad depicted in FIG. 3 could be an input pad, an output pad, or an I/O pad. Two SCRs, 3A and 3B, are exemplified in FIG. 3, but it is not intended to limit the scope of the invention to such a structure. Intuitively, one SCR or a number of SCRs greater than two would be suitable for the present invention.

In FIG. 3, the SCR 3A is configured with its anode 31 connected to the pad 1 and its cathode 32 connected to a circuit grounding node $V_{SS}$. Similarly, the SCR 3B is configured with its anode 35 connected to the pad 1 and its cathode 36 connected to the circuit grounding node $V_{SS}$. However, the EPROM 4 is provided with its drain connected to the pad 1, its source connected to the circuit grounding node $V_{SS}$, and its control gate either directly connected to the circuit grounding node $V_{SS}$ or coupled, as shown in FIG. 3, thereto by a resistor R.

The SCR 3A comprises a PNP bipolar junction transistor $Q_1$, a NPN bipolar junction transistor $Q_2$, and two load resistors $R_1$ and $R_2$. The emitter of the PNP bipolar junction transistor $Q_1$ serves as the anode 31 of the SCR 3A. The PNP bipolar junction transistor $Q_1$ is configured with its base connected to the collector of the NPN bipolar junction transistor $Q_2$ to be an anode gate 33, and with its collector connected to the base of the NPN bipolar junction transistor $Q_2$ to be a cathode gate 34. The emitter of the NPN bipolar junction transistor $Q_2$ serves as the cathode 32 of the SCR 3A. The resistor $R_1$ is connected between the anode 31 and the anode gate 33 while the resistor $R_2$ is connected between the cathode gate 34 and the cathode 32.

Similarly, the SCR 3B comprises a PNP bipolar junction transistor $Q_3$, a NPN bipolar junction transistor $Q_4$, and two load resistors $R_3$ and $R_4$. The emitter of the PNP bipolar junction transistor $Q_3$ serves as the anode 35 of the SCR 3B. The PNP bipolar junction transistor $Q_3$ is configured with its base connected to the collector of the NPN bipolar junction transistor $Q_4$ to be an anode gate 37, and with its collector connected to the base of the NPN bipolar junction transistor $Q_4$ to be a cathode gate 38. The emitter of the NPN bipolar junction transistor $Q_4$ serves as the cathode 36 of the SCR 3B. The resistor $R_3$ is connected between the anode 35 and the anode gate 37 while the resistor $R_4$ is connected between the cathode gate 38 and the cathode 36.

Figure 4:
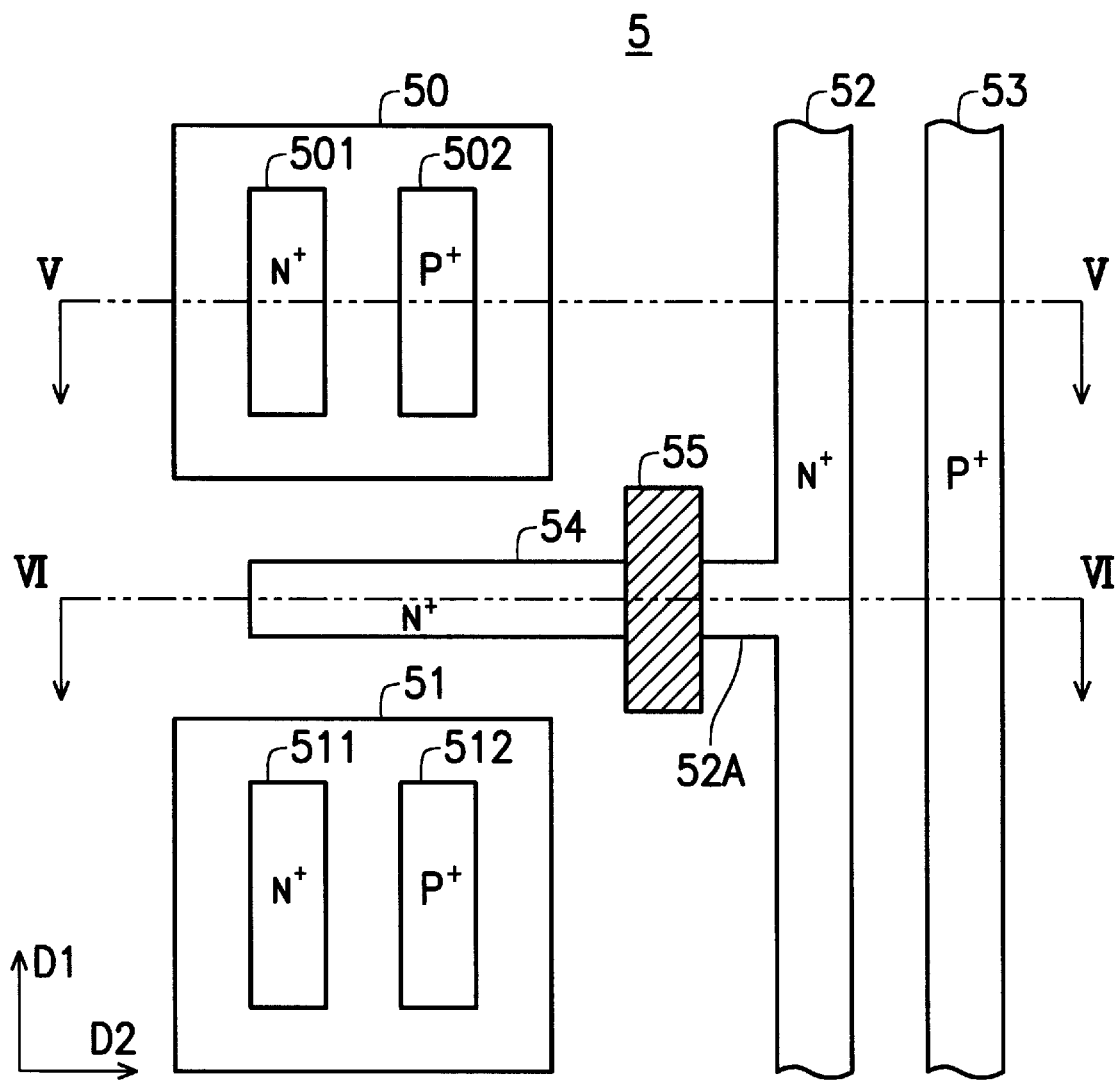
FIG. 4 schematically illustrates a layout top view of the circuit of FIG. 3 that is fabricated in a P-type silicon substrate.

Referring to FIG. 4, the circuit of FIG. 3 fabricated in a P-type silicon substrate 5 is schematically illustrated in a layer top view. FIG. 4 shows one example of several feasible embodiments. In the drawing, there are two N-wells 50 and 51 formed in the P-type silicon substrate 5, both of which are spaced apart from each other along a first direction D1. A pair of first P-type doped regions 502 and 512 are formed in the N-wells 50 and 51, respectively. A first N-type doped region 52 is formed in the P-type silicon substrate 5 extending along the first direction D1. In addition, the first N-type doped region 52 is spaced apart from the same sides of the N-wells 50 and 51 along a second direction D2 if both N-wells 50 and 51 are implemented by a four-sided shape. Furthermore, the first N-type doped region 52 extends somewhat to the spacing between two N-wells 50 and 51 to be an extension portion 52A and thus provided with T-shape. A second N-type doped region 54 is formed in the P-type silicon substrate 5 between the N-wells 50 and 51, and aligned with the extension portion 52A as well as spaced apart from the first N-type doped region 52. A gate structure 55 is formed to overlie a portion of the P-type silicon substrate 5 between the N-type doped regions 52 (exactly, the extension portion 52A) and 54. From bottom to top, the gate structure 55 comprises a gate dielectric layer 551, a floating gate layer 552, an inter-layer dielectric layer 553, and a control gate layer 554. Usually, the gate structure 55 somewhat overlaps the N-type doped regions 52 (exactly, the extension portion 52A) and 54 at two ends.

Figure 5:
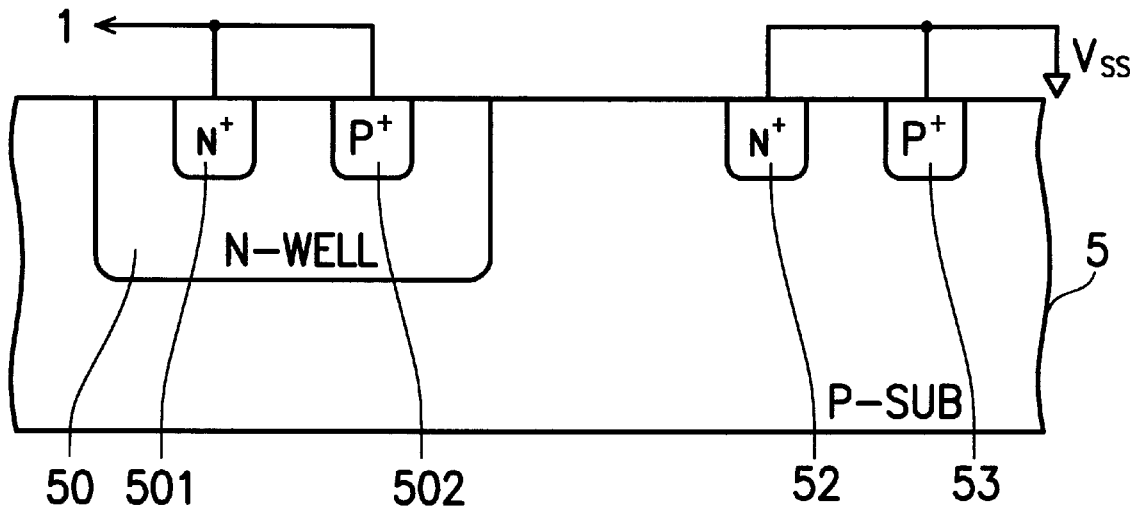
FIG. 5 schematically illustrates a cross-sectional view, taken along a line V—V, of FIG. 4.
Figure 6:
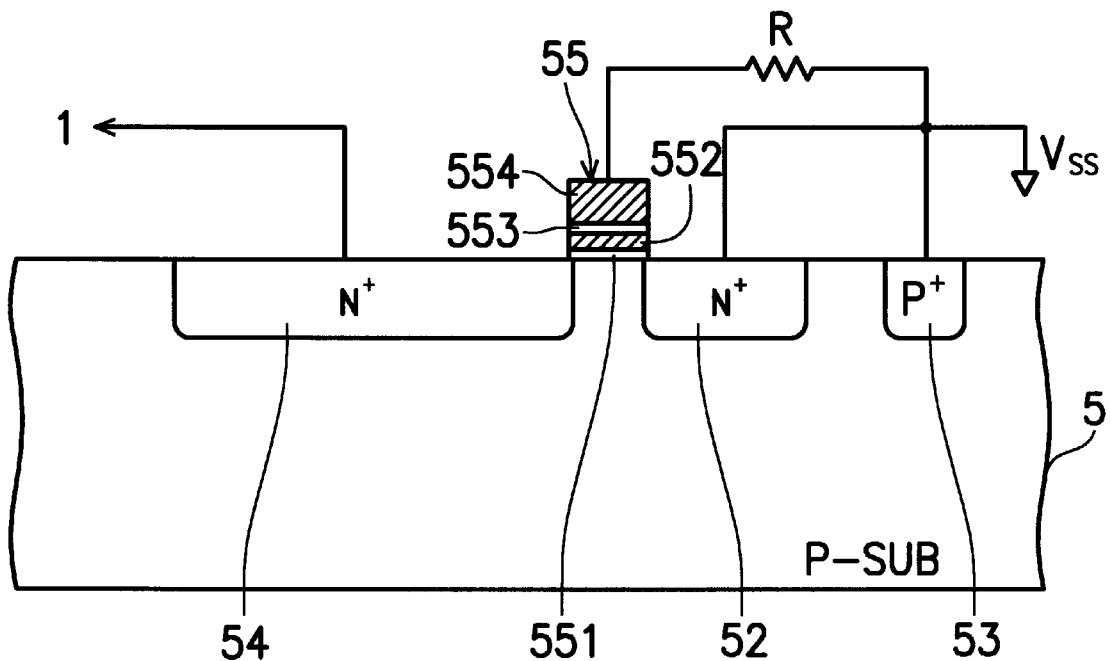
FIG. 6 schematically illustrates a cross-sectional view, taken along a line VI—VI, of FIG. 4.

In addition, a second P-type doped region 53 is formed in the P-type silicon substrate 5 along the first direction DI so as be spaced apart from the first N-type doped region 52 in parallel, preferably, to be the ohmic contact region of the P-type silicon substrate 5. Moreover, a pair of third N-type doped regions 501 and 511 are formed in the respective N-wells 50 and 51 to be the ohmic contact regions thereof. FIGS. 5 and 6 illustrate respective cross-sectional views of FIG. 4 taken along V—V and VI—VI lines.

As shown in FIG. 5, the first P-type doped region 502, the N-well 50 and the P-type silicon substrate 5 serve as the emitter, base and collector of the PNP bipolar junction transistor $Q_1$ while the N-well 50, the P-type silicon substrate 5 and the first N-type doped region 52 build up the collector, base and emitter of the NPN bipolar junction transistor $Q_2$. Accordingly, such a structure means that the base of the transistor $Q_1$ and the collector of the transistor $Q_2$ are tied together, and the collector of the transistor $Q_1$ and the base of the transistor $Q_2$ are tied together. The transistors $Q_1$ and $Q_2$ are provided with their emitters connected to the pad 1 and $V_{SS}$, respectively. The third N-type doped region 501 is tied to the first P-type doped region 502 while the first N-type doped region 52 is electrically connected to the second P-type doped region 53. The resistors $R_1$ and $R_2$ stand for associated spreading resistance of the N-well 50 and the P-type silicon substrate 5 as well, so as to enhance the stability of the SCR 3A.

For the same reason, the first P-type doped region 512, the N-well 51, and the P-type silicon substrate 5 serve as the emitter, base and collector of the PNP bipolar junction transistor $Q_3$ while the N-well 51, the P-type silicon substrate 5 and the first N-type doped region 52 build up the collector, base and emitter of the NPN bipolar junction transistor $Q_4$. Accordingly, such a structure means that the base of the transistor $Q_3$ and the collector of the transistor $Q_4$ are tied together, and the collector of the transistor $Q_3$ and the base of the transistor $Q_4$ are tied together. The transistors $Q_3$ and $Q_4$ are provided with their emitters connected to the pad 1 and $V_{SS}$, respectively. The third N-type doped region 511 is tied to the first P-type doped region 512. The resistors $R_3$ and $R_4$ stand for associated spreading resistance of the N-well 51 and the P-type silicon substrate 5 as well, so as to enhance the stability of the SCR 3B.

As shown in FIG. 6, the EPROM 4 is provided with its drain, control gate, and source constituted by the second N-type doped region 54, gate structure 55, and first N-type doped region 52, respectively. The second N-type doped region 54 is connected to the pad 1 when the first N-type doped region 52 is connected to the grounding node $V_{SS}$. However, the gate structure 55 is coupled to the grounding node $V_{SS}$ via the resistor R.

When ESD stress occurs to the pad 1, the drain-side junction of the EPROM 4 enters breakdown at a voltage in the range of about 9~20 V. This breakdown voltage can be adjusted for optimization during fabrication process. After the EPROM 4 breaks down, generated hot holes flow toward the cathodes of the SCRs 3A and 3B resulting in that the SCRs 3A and 3B operate in the snapback region and conduct a discharge current. Therefore, the conduction of the SCRs 3A and 3B can bypass the ESD stress that occurs to the pad 1 and the internal circuit 2 can be protected from ESD damage. Under normal operation, the control gate of the EPROM 4 is grounded via the resistor R, thereby the control gate is free of floating.

Moreover, when the EPROM 4 enters breakdown, hot electrons are generated at the drain-side junction and then injected into the floating gate layer 552 through the gate dielectric layer 551 under the influence of the local high electric field, in other words, made available for programming. To program the EPROM 4 means to change the conductance or the threshold voltage thereof. Thereafter, by measuring the conductance or threshold voltage of the EPROM 4, whether the ESD stress occurs to the pad 1 during the phase of testing, installation, or even usage can be acknowledged. For example, a measurement method can be implemented by applying a voltage at the control gate and reading the current value at the drain.

Figure 7:
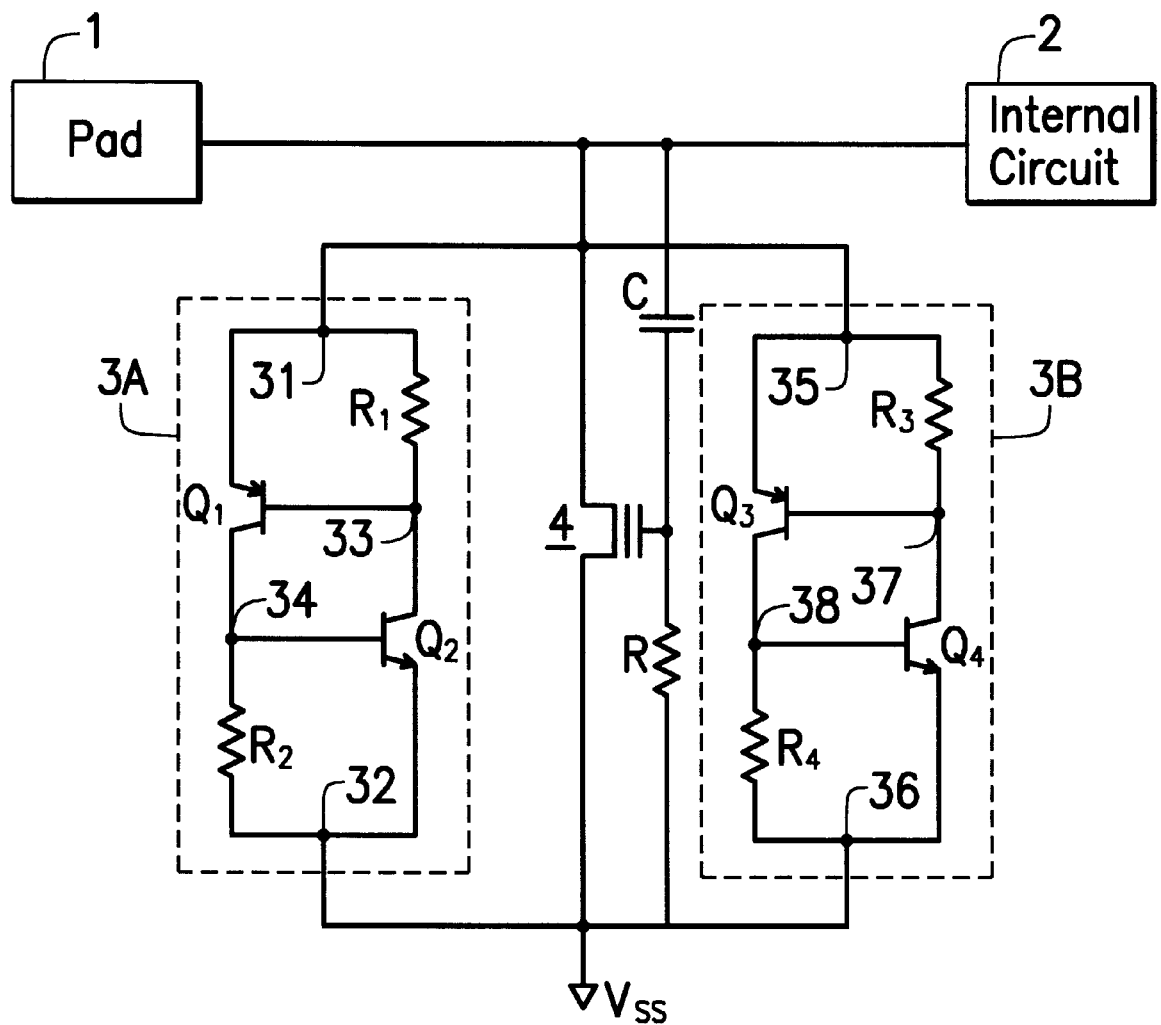
FIG. 7 schematically illustrates a circuit diagram of another preferred embodiment in accordance with the present invention.

Referring to FIG. 7, a circuit diagram of another preferred embodiment in accordance with the present invention is schematically illustrated. In addition to those features illustrated in FIG. 3, the control gate of the EPROM 4 depicted in FIG. 7 is coupled to the pad 1 by a capacitor C. Therefore, when ESD stress occurs to the pad 1, the capacitor C couples a voltage to the control gate. If the resistor R and the capacitor C are appropriately chosen, the coupling voltage ranges from about half to about nine-tenths of the pad voltage by which the EPROM 4 is programmed. After that, the threshold voltage of the EPROM 4 is increased from about 0.7 V to the range of 1.1~2 V. Furthermore, the capacitor C can maintain the high voltage coupling to the control gate for a period sufficient to program the EPROM 4. Under normal operation, the control gate of the EPROM 4 has the same electrical potential as $V_{SS}$ by the resistor R and is free of floating problems.

Reasonably, the EPROM 4 can be replaced by an electrically erasable programmable read only memory (EEPROM) cell or a split-gate flash memory cell.

In conclusion, the electrostatic discharge protection circuit according to the present invention includes the EPROM and at least one SCR. When ESD stress occurs to the pad, the EPROM enters breakdown and triggers the SCR to operate in the snapback region for bypassing the ESD stress in order to prevent the internal circuit from ESD damage. Accordingly, the electrostatic discharge protection circuit according to the present invention can be triggered at the low voltage at which the EPROM enters breakdown. Moreover, the electrostatic discharge protection circuit according to the present invention can record any ESD event occurring during phases of testing, installation, usage, etc.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention, practice various other embodiments and make various modifications suited to the particular use contemplated. It is intended that the scope of the invention be defined by the following claims and their equivalents.

What is claimed is:

1. An electrostatic discharge protection circuit for protecting an internal circuit which is coupled to a pad, said electrostatic discharge protection circuit comprising:
    at least one silicon-controlled rectifier having an anode and a cathode connected to said pad and a circuit node, respectively; and
    an erasable programmable read only memory having a drain connected to said pad, a source connected to said circuit node, and a control gate connected to said circuit node; wherein said erasable programmable read only memory enters breakdown to be programmed and triggers the conduction of said silicon-controlled rectifier when electrostatic discharge stress occurs at said pad.

2. The electrostatic discharge protection circuit as claimed in claim 1, wherein said silicon-controlled rectifier comprises:
    a PNP transistor having its emitter to be said anode; and
    an NPN transistor having its collector connected to a base of said PNP transistor to be an anode gate, its base connected to a collector of said PNP transistor to be a cathode gate, and its emitter to be said cathode.

3. The electrostatic discharge protection circuit as claimed in claim 2, wherein said silicon-controlled rectifier further comprises:
    a first load resistor connected between said anode and said anode gate; and a second load resistor connected between said cathode and said cathode gate.

4. The electrostatic discharge protection circuit as claimed in claim 1, further comprising a resistor connected between said control gate and said circuit node.

5. The electrostatic discharge protection circuit as claimed in claim 4, further comprising a capacitor connected between said pad and said control gate.

6. The electrostatic discharge protection circuit as claimed in claim 1, said electrostatic discharge protection circuit being formed in a P-type silicon substrate while the number of said silicon-controlled rectifiers is two, comprising:

two N-wells formed in said P-type silicon substrate and spaced apart from each other;

a P-type doped region formed in each said respective N-well;

a first N-type doped region formed in said P-type silicon substrate and spaced apart from said N-wells;

a second N-type doped region formed in said P-type silicon substrate between said N-wells and spaced apart from said first N-type doped region; and a gate structure, which is constituted by a gate dielectric layer, a floating gate layer, an inter-layer dielectric layer, and a control gate layer, formed on a portion of said P-type silicon substrate between said N-type doped regions.

7. The electrostatic discharge protection circuit as claimed in claim 1, wherein said erasable programmable read only memory is an electrically erasable programmable read only memory cell.

8. The electrostatic discharge protection circuit as claimed in claim 1, wherein said erasable programmable read only memory is a split-gate flash memory cell.

9. An electrostatic discharge protection circuit for protecting an internal circuit which is coupled to a pad, said electrostatic discharge protection circuit comprising:

a silicon-controlled rectifier having an anode and a cathode connected to said pad and a circuit node, respectively;

an erasable programmable read only memory having a drain connected to said pad, a source connected to said circuit node, and a control gate connected to said circuit node;

a capacitor connected between said control gate and said pad; and a resistor connected between said control gate and said circuit node;

wherein said erasable programmable read only memory enters breakdown to be programmed via said capacitor and triggers the conduction of said silicon-controlled rectifier when electrostatic discharge stress occurs at said pad, wherein said control gate has the same electrical potential as that of said circuit node by said resistor under normal operation.

10. The electrostatic discharge protection circuit as claimed in claim 9, wherein said silicon-controlled rectifier comprises:

a PNP transistor having its emitter to be said anode; and an NPN transistor having its collector connected to a base of said PNP transistor to be an anode gate, its base connected to a collector of said PNP transistor to be a cathode gate, and its emitter to be said cathode.

11. The electrostatic discharge protection circuit as claimed in claim 10, wherein said silicon-controlled rectifier further comprises:

a first load resistor connected between said anode and said anode gate; and a second load resistor connected between said cathode and said cathode gate.

12. The electrostatic discharge protection circuit as claimed in claim 9, wherein said erasable programmable read only memory is an electrically erasable programmable read only memory cell.

13. The electrostatic discharge protection circuit as claimed in claim 9, wherein said erasable programmable read only memory is a split-gate flash memory cell.

* * * * *